(12) United States Patent
Li (10) Patent No.: US 10,340,673 B2
(45) Date of Patent: Jul. 2, 2019

(54) ELECTRONIC DEVICE (71) Applicant: BENQ CORPORATION, Taipei (TW)

(72) Inventor: Chih-Wen Li, Taoyuan (TW)

(73) Assignee: BenQ Corporation, Taipei (TW)

( * ) Notice: Subject to any disclaimer, the term of this patent is extended or adjusted under 35 U.S.C. 154(b) by 0 days.

(21) Appl. No.: 15/990,700

(22) Filed: May 28, 2018

(65) Prior Publication Data
US 2018/0358795 A1 Dec. 13, 2018

(30) Foreign Application Priority Data

Jun. 7, 2017 (TW) .............................. 106118834 A (51) Int. Cl.
H02B 1/20 (2006.01)
H02G 3/04 (2006.01)
H05K 5/02 (2006.01)
F16M 11/22 (2006.01)
G06F 1/16 (2006.01)

(52) U.S. Cl.
CPC ........... *H02G 3/0437* (2013.01); *F16M 11/22* (2013.01); *G06F 1/1601* (2013.01); *H02G 3/0418* (2013.01); *H05K 5/0234* (2013.01); *H05K 5/0247* (2013.01); *F16M 2200/065* (2013.01); *F16M 2200/08* (2013.01)

(58) Field of Classification Search
USPC ....................................................... 361/826
See application file for complete search history.

(56) References Cited

U.S. PATENT DOCUMENTS

| 6,067,835 A * | 5/2000 | Pollock | B21F 1/02 140/147 |
| 6,168,124 B1 | 1/2001 | Matsuoka | |
| 6,229,584 B1 * | 5/2001 | Chuo | G06F 1/1601 248/917 |
| 6,816,364 B2 * | 11/2004 | Helot | F16M 11/105 248/919 |
| 6,865,087 B2 * | 3/2005 | Jelinger | H02G 3/32 174/138 G |
| 8,797,728 B2 * | 8/2014 | Han | F16M 11/10 248/917 |
| 2005/0201046 A1 | 9/2005 | Hwang | |

(Continued)

FOREIGN PATENT DOCUMENTS

CN 205155493 U 4/2016
WO 2007/104157 A1 9/2007

*Primary Examiner* — Hung S. Bui (57) ABSTRACT

An electronic device includes a support frame, an electronic unit and a cable. The support frame includes a frame body and a first cable management unit. The frame body has a cable management recess and a cable management hole, wherein the cable management recess communicates with the cable management hole. The first cable management unit is connected to the frame body and rotatably located in the cable management recess. The electronic unit is disposed on the frame body. The cable has a first end and a second end opposite to the first end. The first end is connected to the electronic unit and the second end passes through the cable management hole to enter the cable management recess. The first cable management unit limits the cable in the cable management recess. When the cable is pulled to move, the first cable management unit rotates along with the cable.

14 Claims, 11 Drawing Sheets (56) References Cited

U.S. PATENT DOCUMENTS

2008/0198542 A1* 8/2008 Kim .................. G06F 1/1616
  361/679.27
2016/0091116 A1* 3/2016 Shoecraft ............. H02G 3/0456
  211/41.1

* cited by examiner

ELECTRONIC DEVICE

BACKGROUND OF THE INVENTION

1. Field of the Invention

The invention relates to an electronic device and, more particularly, to an electronic device having a support frame equipped with a rotatable cable management unit.

2. Description of the Prior Art

Since a liquid crystal display (LCD) device has advantages of thin thickness, light weight, low power consumption, no radiation pollution, and being compatible with semiconductor process, the LCD device is considered a necessity by a lot of people in their daily lives. In general, the LCD device is fixed on a support frame, such that the LCD device can be placed on a plane by the support frame for a user. Furthermore, the LCD device has a plurality of connectors for connecting different cables, such as power cable, High Definition Multimedia Interface (HDMI) cable, audio cable, and so on. If the cables are not managed appropriately, the cables may be disorderly and unsightly. Therefore, how to utilize the support frame to store the cable has become a significant issue in designing the support frame.

SUMMARY OF THE INVENTION

An objective of the invention is to provide an electronic device having a support frame equipped with a rotatable cable management unit, so as to solve the aforesaid problems.

According to an embodiment of the invention, an electronic device comprises a support frame, an electronic unit and a cable. The support frame comprises a frame body and a first cable management unit. The frame body has a cable management recess and a cable management hole, wherein the cable management recess communicates with the cable management hole. The first cable management unit is connected to the frame body and rotatably located in the cable management recess. The electronic unit is disposed on the frame body. The cable has a first end and a second end opposite to the first end. The first end is connected to the electronic unit and the second end passes through the cable management hole to enter the cable management recess. The first cable management unit limits the cable in the cable management recess. The first cable management unit rotates along with the cable when the cable is pulled to move.

As mentioned in the above, the invention disposes a rotatable cable management unit in the support frame. A user can insert the cable into the cable management hole of the support frame to store the cable in the cable management recess of the support frame and utilize the cable management unit to limit the cable in the cable management recess. Since the cable management unit is rotatable, the cable management unit will rotate along with the cable when the cable is pulled to move. Accordingly, the user can pull the cable to move smoothly to manage the cable stored in the cable management recess of the support frame. Therefore, the invention can achieve cable management function and enhance visual effect for the electronic device by the support frame.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
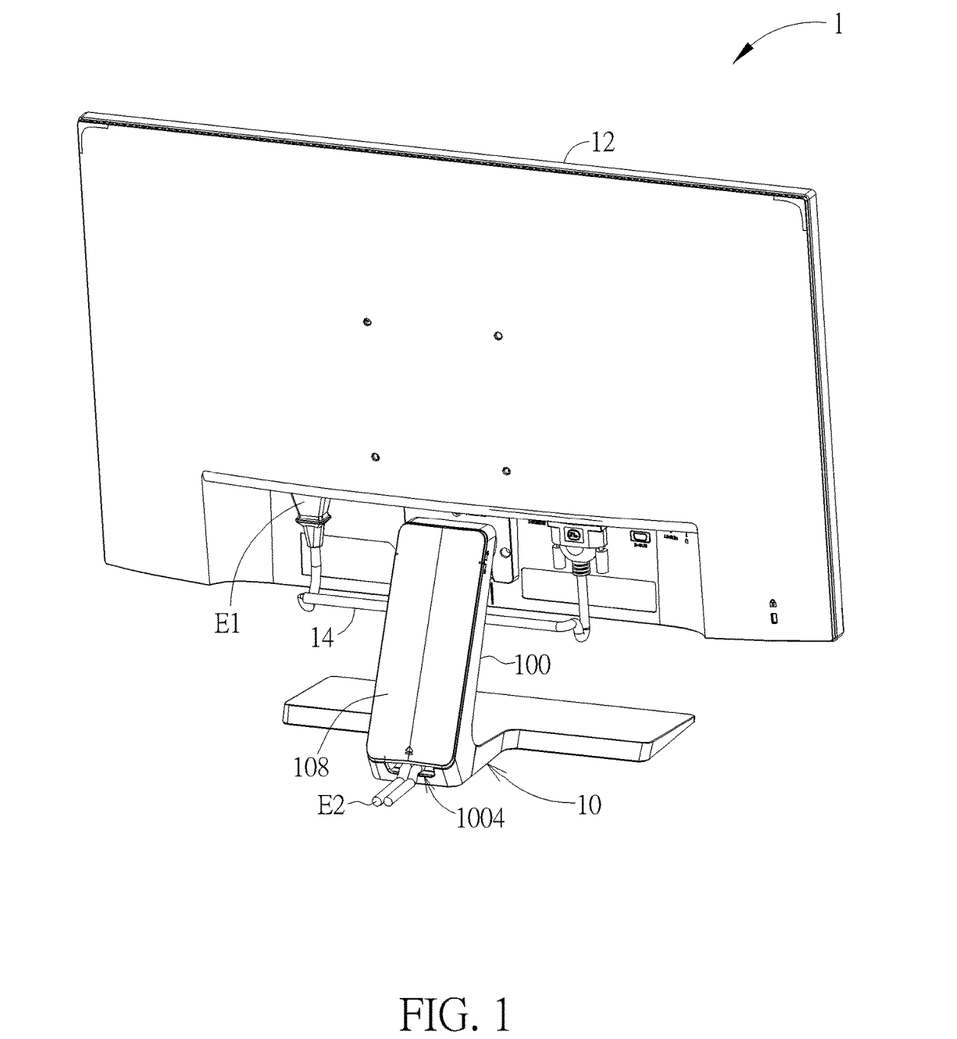
FIG. 1 is a perspective view illustrating an electronic device according to an embodiment of the invention.
Figure 2:
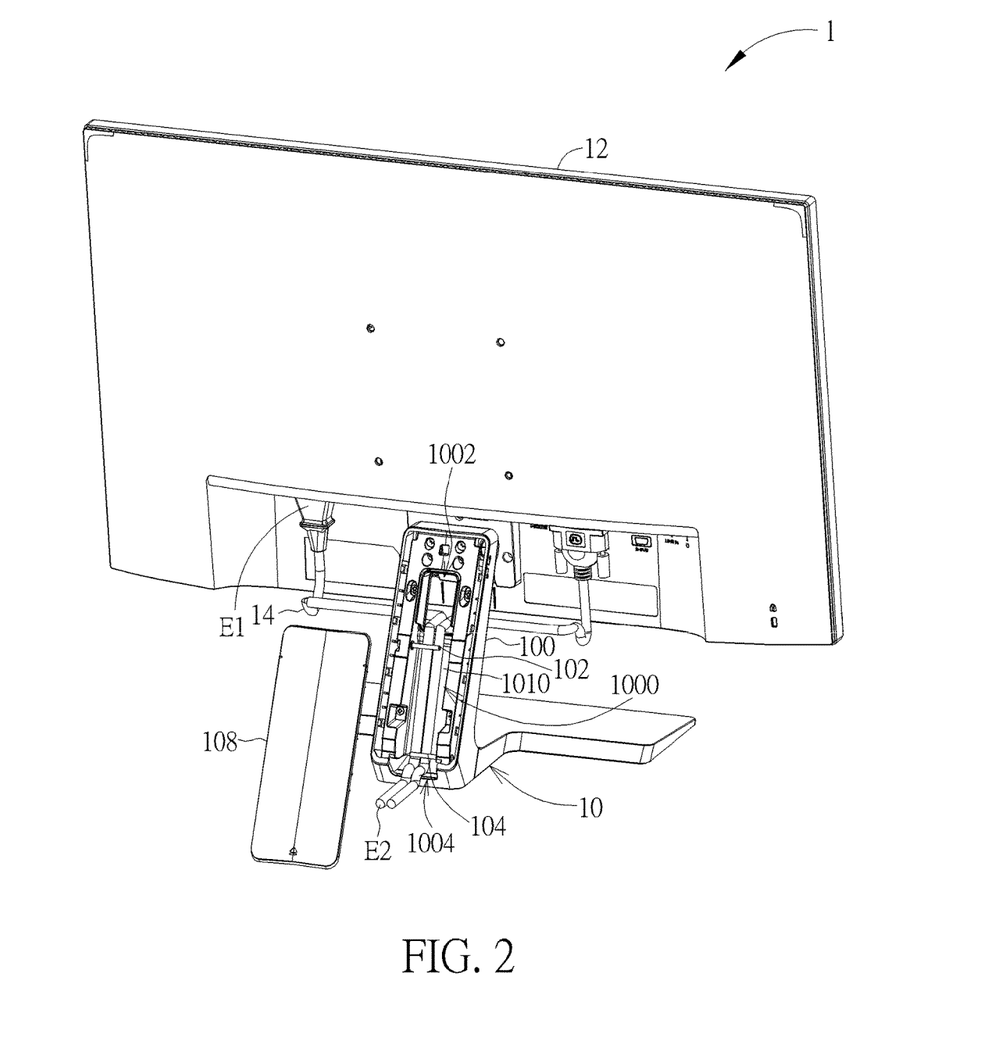
FIG. 2 is a perspective view illustrating the cover separated from the frame body shown in FIG. 1.
Figure 3:
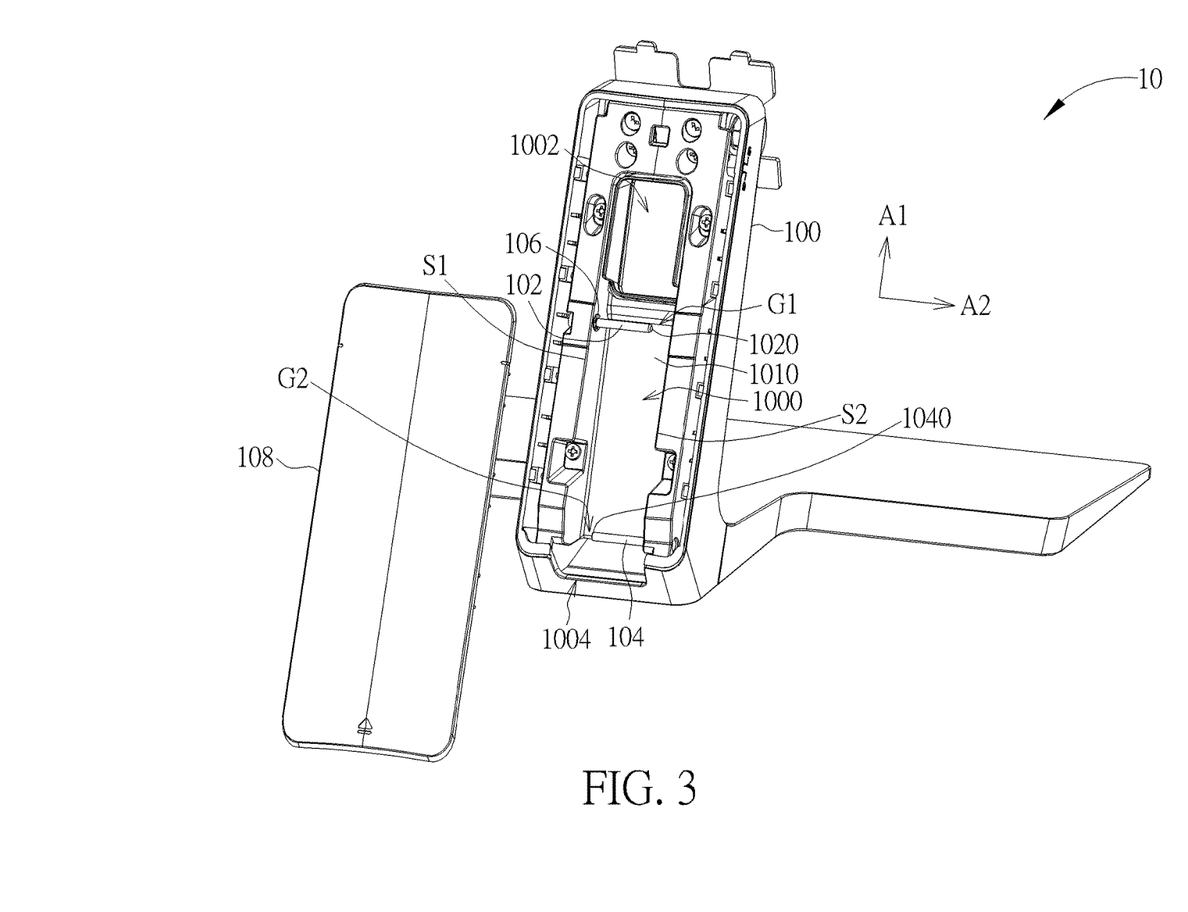
FIG. 3 is a perspective view illustrating the support frame shown in FIG. 2.
Figure 4:
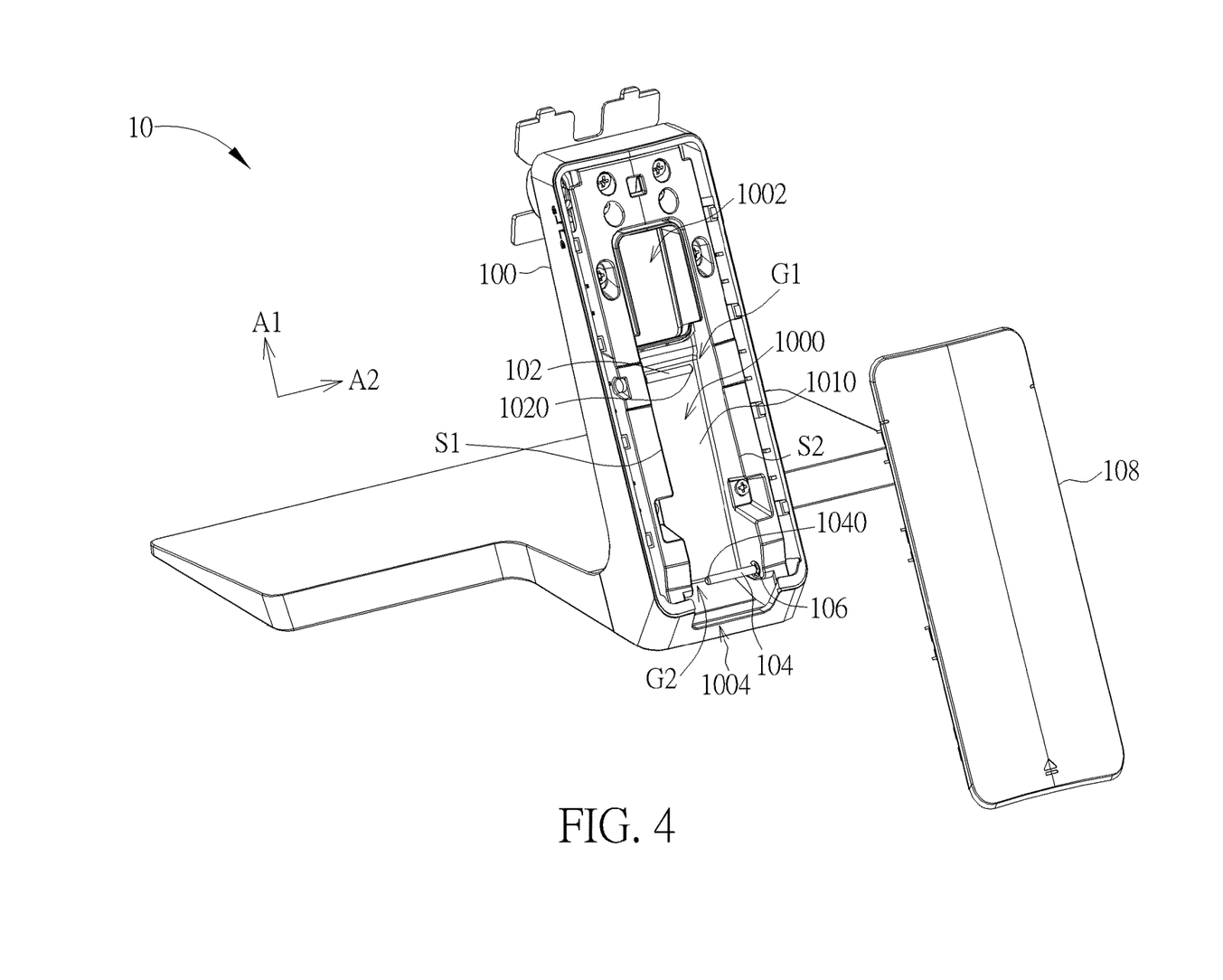
FIG. 4 is a perspective view illustrating the support frame shown in FIG. 3 from another viewing angle.
Figure 5:
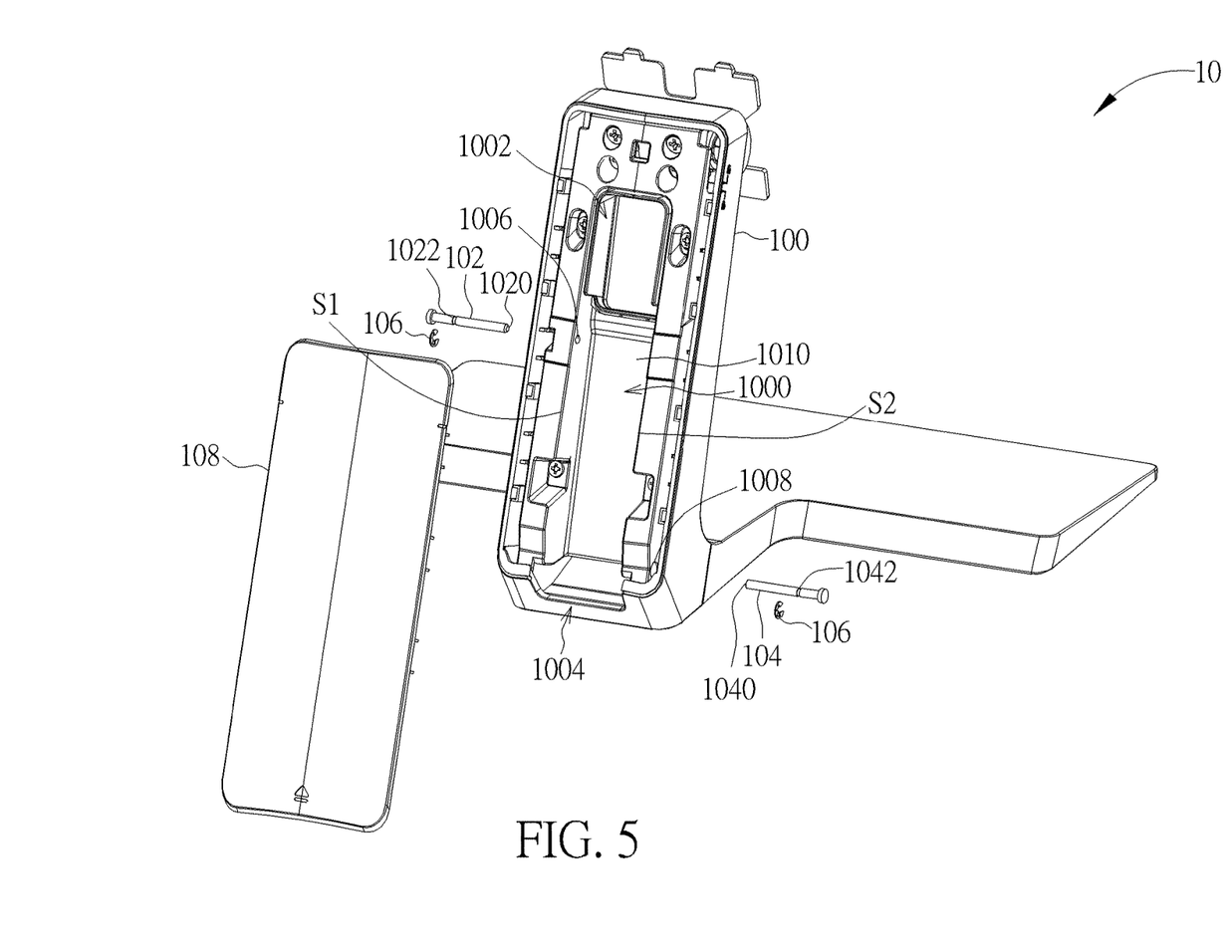
FIG. 5 is a partial exploded view illustrating the support frame shown in FIG. 3.

Referring to FIGS. 1 to 5, FIG. 1 is a perspective view illustrating an electronic device 1 according to an embodiment of the invention, FIG. 2 is a perspective view illustrating the cover 108 separated from the frame body 100 shown in FIG. 1, FIG. 3 is a perspective view illustrating the support frame 10 shown in FIG. 2, FIG. 4 is a perspective view illustrating the support frame 10 shown in FIG. 3 from another viewing angle, and FIG. 5 is a partial exploded view illustrating the support frame 10 shown in FIG. 3.

As shown in FIGS. 1 and 2, the electronic device 1 comprises a support frame 10, an electronic unit 12 and two cables 14. In practical applications, the electronic unit 12 may be an LCD device, a plasma display device or other electronic devices capable of being disposed on the support frame 10, and the cable 14 may be a power cable, a HDMI cable, an audio cable or other cables capable of being connected to the electronic unit 12. Furthermore, the number of the cables 14 may be one or more according to practical applications.

As shown in FIGS. 3 to 5, the support frame 10 comprises a frame body 100, a first cable management unit 102, a second cable management unit 104, two retainers 106 and a cover 108. The electronic unit 12 is disposed on the frame body 100, such that the electronic unit 12 can be placed on a plane by the support frame 10 for a user. The frame body 100 has a cable management recess 1000, a cable management hole 1002 and a cable outlet 1004. The cable management recess 1000 communicates with the cable management hole 1002 and the cable management recess 1000 also communicates with the cable outlet 1004. The cover 108 is detachably disposed on the frame body 100 and covers the cable management recess 1000. In practical applications, the cover 108 may be disposed on the frame body 100 by engagement, screw or other fixing manners.

The first cable management unit 102 is connected to the frame body 100 and rotatably located in the cable management recess 1000. The second cable management unit 102 is also connected to the frame body 100 and rotatably located in the cable management recess 1000. In this embodiment, the first cable management unit 102 and the second cable management unit 104 are staggered. As shown in FIGS. 3 and 4, the first cable management unit 102 is close to the cable management hole 1002 and the second cable management unit 104 is close to the cable outlet 1004. It should be noted that the positions of the first cable management unit 102 and the second cable management unit 104 can be determined according to practical applications, so they are not limited to the embodiment shown in the figures.

In this embodiment, the first cable management unit 102 may be connected to a first side S1 of the frame body 100 and a free end 1020 of the first cable management unit 102 may be oriented toward a second side S2 of the frame body 100, wherein the first side S1 is opposite to the second side S2. Accordingly, a gap G1 exists between the free end 1020 of the first cable management unit 102 and the second side S2 of the frame body 100. The second cable management unit 104 may be connected to the second side S2 of the frame body 100 and a free end 1040 of the second cable management unit 104 may be oriented toward the first side S1 of the frame body 100. Accordingly, a gap G2 exists between the free end 1040 of the second cable management unit 104 and the first side S1 of the frame body 100.

As shown in FIG. 5, the first cable management unit 102 has an indentation 1022 and the second cable management unit 104 has an indentation 1042. To assemble the first cable management unit 102 and the frame body 100, the invention may insert the free end 1020 of the first cable management unit 102 into a hole 1006 on the first side S1 of the frame body 100 and then engage the retainer 106 with the indentation 1022 of the first cable management unit 102, such that the first cable management unit 102 is connected to the first side S1 of the frame body 100 and rotatably located in the cable management recess 1000. Similarly, to assemble the second cable management unit 104 and the frame body 100, the invention may insert the free end 1040 of the second cable management unit 104 into a hole 1008 on the second side S2 of the frame body 100 and then engage the retainer 106 with the indentation 1042 of the second cable management unit 104, such that the second cable management unit 104 is connected to the second side S2 of the frame body 100 and rotatably located in the cable management recess 1000. In this embodiment, the retainer 106 may be a C-shaped or E-shaped ring according to practical applications.

As shown in FIGS. 1 and 2, the cable 14 has a first end E1 and a second end E2 opposite to the first end E1. The first end E1 of the cable 14 is connected to the electronic device 12. In practical applications, the first end E1 of the cable 14 may be a connector. The second end E2 of the cable 14 may pass through the cable management hole 1002 of the frame body 100 to enter the cable management recess 1000. Then, the cable 14 may enter the space between the first cable management unit 102 and a bottom 1010 of the cable management recess 1000 through the gap G1, such that the cable 14 is sandwiched in between the first cable management unit 102 and the bottom 1010 of the cable management recess 1000. Similarly, the cable 14 may enter the space between the second cable management unit 104 and the bottom 1010 of the cable management recess 1000 through the gap G2, such that the cable 14 is sandwiched in between the second cable management unit 104 and the bottom 1010 of the cable management recess 1000. Accordingly, the first cable management unit 102 and the second cable management unit 104 can limit the cable 14 in the cable management recess 1000. Furthermore, the second end E2 of the cable 14 may pass through the cable outlet 1004 of the frame body 100 to protrude from the frame body 100.

Since the first cable management unit 102 and the second cable management unit 104 both are rotatable, the first cable management unit 102 and the second cable management unit 104 will rotate along with the cable 14 when the cable 14 is pulled to move. Accordingly, the user can pull the cable 14 to move smoothly to manage the cable 14 stored in the cable management recess 1000 of the support frame 10. Therefore, the invention can achieve cable management function and enhance visual effect for the electronic device 1 by the support frame 10. Since the first cable management unit 102 and the second cable management unit 104 are staggered, the gaps G1, G2 are located at opposite sides in the cable management recess 1000. Even if the cable 14 comes off the first cable management unit 102 from the gap G1, the cable 14 is still limited by the second cable management unit 104. Similarly, even if the cable 14 comes off the second cable management unit 104 from the gap G2, the cable 14 is still limited by the first cable management unit 102. Accordingly, the invention can limit the cable 14 in the cable management recess 1000 effectively.

In this embodiment, the cable management recess 1000 has a first axial direction A1, and the first cable management unit 102 and the second cable management unit 104 have a second axial direction A2, wherein the first axial direction A1 is different from the second axial direction A2. Since the cable 14 is arranged in the cable management recess 1000 in the first axial direction A1 and the second axial direction A2 of the first cable management unit 102 and the second cable management unit 104 is different from the first axial direction A1 of the cable management recess 1000, the first cable management unit 102 and the second cable management unit 104 can limit the cable 14 in the cable management recess 1000 effectively. Preferably, the second axial direction A2 of the first cable management unit 102 and the second cable management unit 104 may be perpendicular to the first axial direction A1 of the cable management recess 1000, but is not so limited.

It should be noted that the invention may utilize one single first cable management unit 102 or one single second cable management unit 104 to limit the cable 14 in the cable management recess 1000. In other words, the invention is not limited to dispose the first cable management unit 102 and the second cable management unit 104 in the support frame 10 at the same time. Needless to say, in addition to the first cable management unit 102 and the second cable management unit 104, the invention may further dispose other cable management units in the support frame 10.

Figure 6:
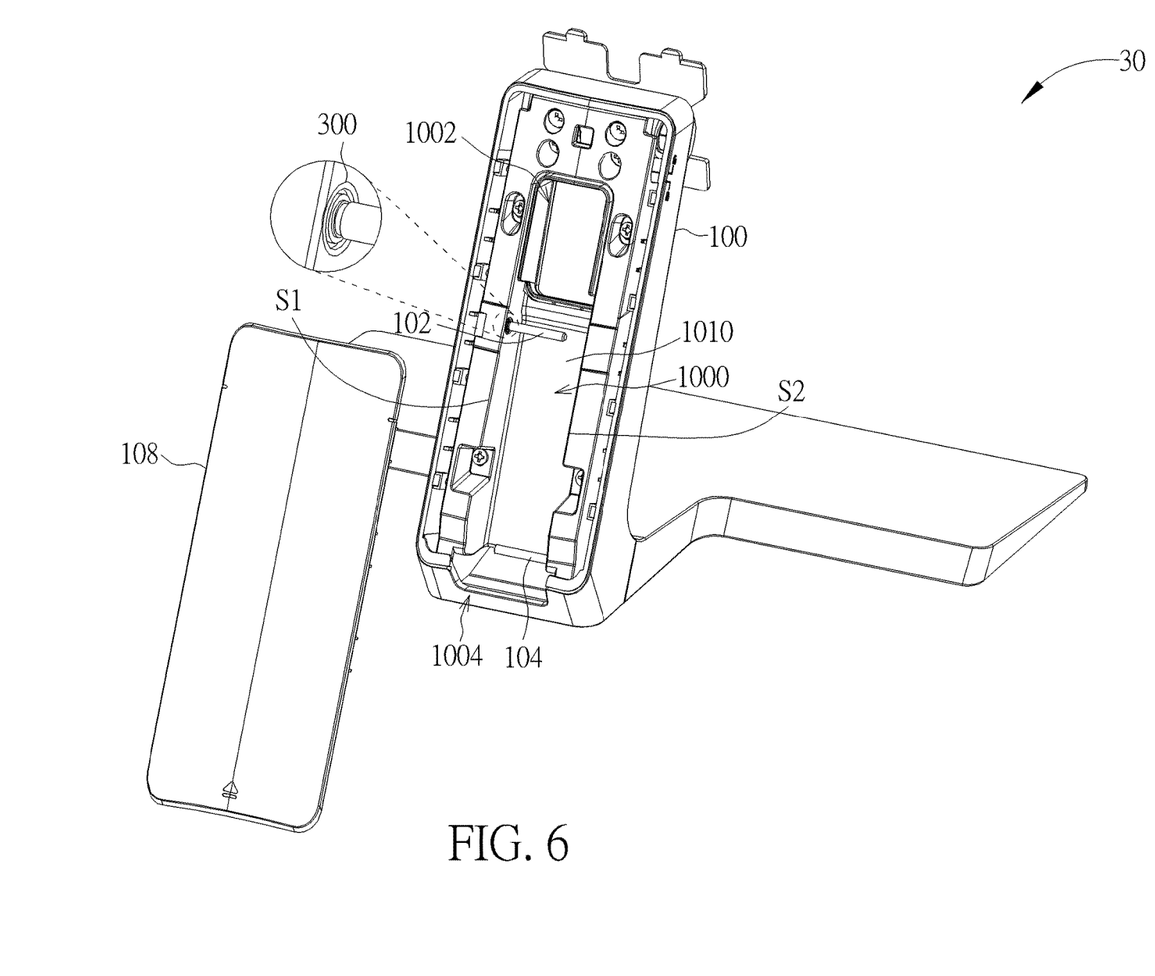
FIG. 6 is a perspective view illustrating a support frame according to another embodiment of the invention.
Figure 7:
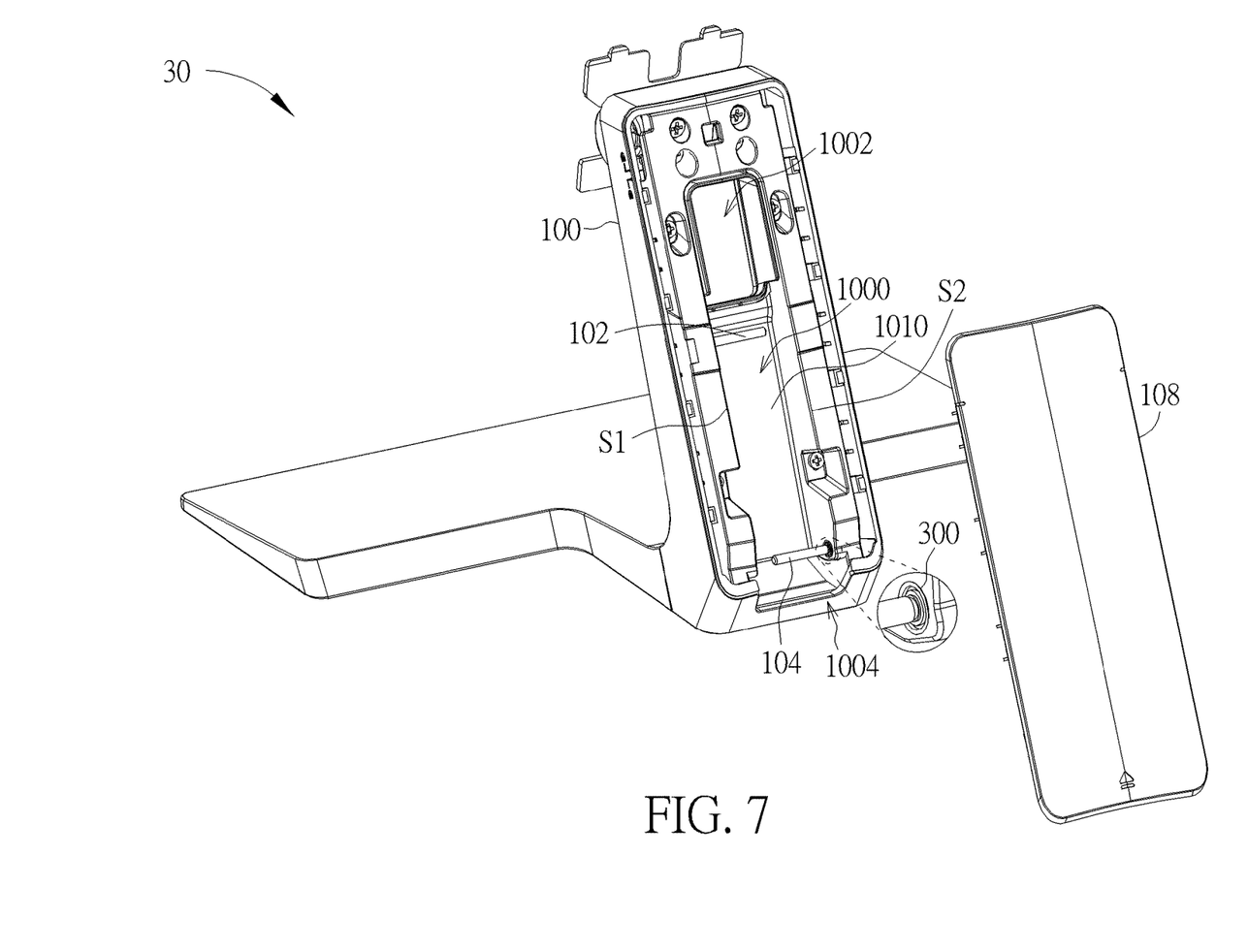
FIG. 7 is a perspective view illustrating the support frame shown in FIG. 6 from another viewing angle.

Referring to FIGS. 6 and 7, FIG. 6 is a perspective view illustrating a support frame 30 according to another embodiment of the invention and FIG. 7 is a perspective view illustrating the support frame 30 shown in FIG. 6 from another viewing angle. The main difference between the support frame 30 and the aforesaid support frame 10 is that the support frame 30 further comprises two bearings 300, as shown in FIGS. 6 and 7. In this embodiment, the bearings 300 are disposed on the first side S1 and the second side S2 of the frame body 100, respectively. The first cable management unit 102 and the second cable management unit 104 are connected to the bearings 300, such that the first cable management unit 102 and the second cable management unit 104 are connected to the first side S1 and the second side S2 of the frame body 100 and rotatably located in the cable management recess 1000. In practical applications, the bearing 300 may be, but not limited to, a ball bearing. The first cable management unit 102 and the second cable management unit 104 can rotate more smoothly by means of the bearings 300.

Figure 8:
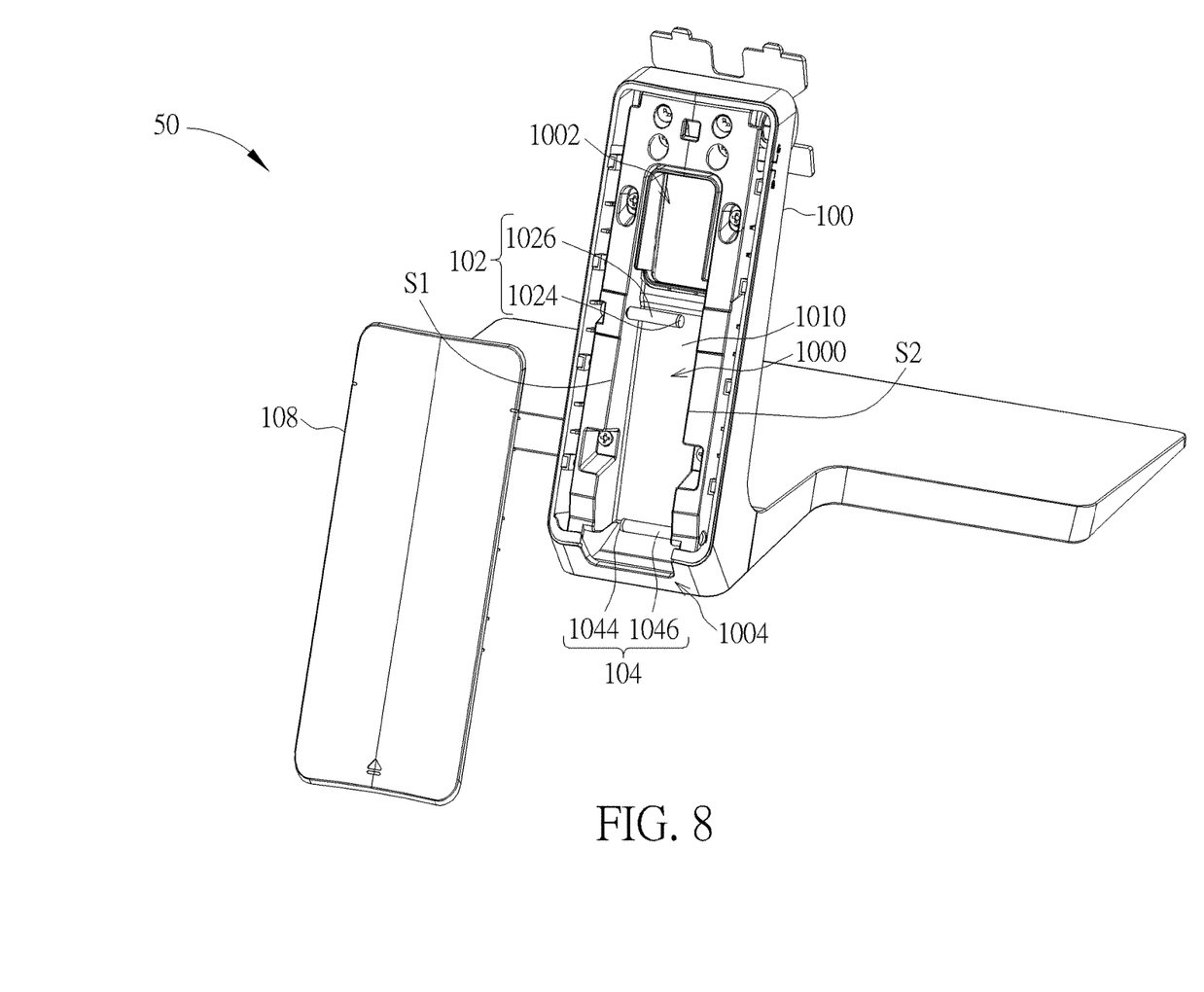
FIG. 8 is a perspective view illustrating a support frame according to another embodiment of the invention.
Figure 9:
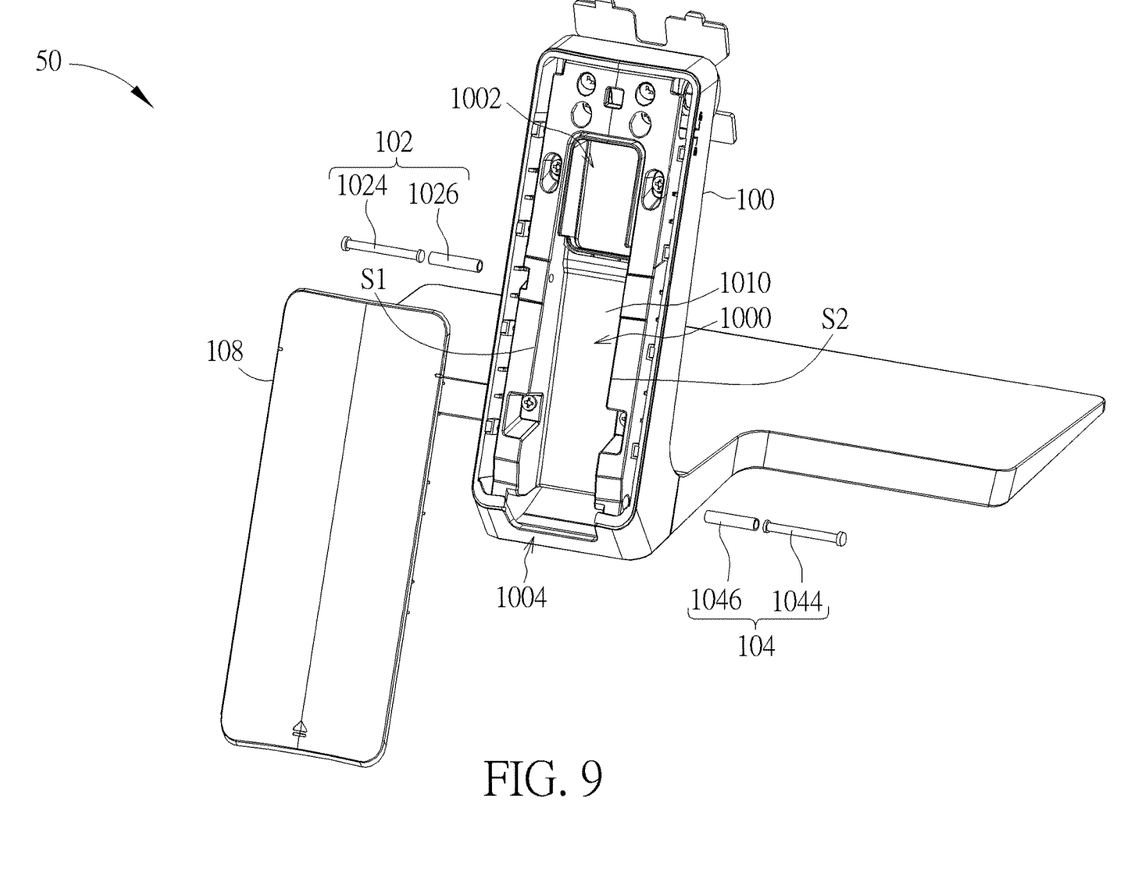
FIG. 9 is a partial exploded view illustrating the support frame shown in FIG. 8.

Referring to FIGS. 8 and 9, FIG. 8 is a perspective view illustrating a support frame 50 according to another embodiment of the invention and FIG. 9 is a partial exploded view illustrating the support frame 50 shown in FIG. 8. The main difference between the support frame 50 and the aforesaid support frame 10 is that the first cable management unit 102 of the support frame 50 comprises a rod 1024 and a sleeve 1026, and the second cable management unit 104 of the support frame 50 comprises a rod 1044 and a sleeve 1046, as shown in FIGS. 8 and 9. In this embodiment, the rod 1024 is fixed on the first side S1 of the frame body 100 and the sleeve 1026 is rotatably sleeved on the rod 1024, so as to form the first cable management unit 102. Furthermore, the rod 1044 is fixed on the second side S2 of the frame body 100 and the sleeve 1046 is rotatably sleeved on the rod 1044, so as to form the second cable management unit 104. In practical applications, the rods 1024, 1044 may be fixed on the frame body 100 by tight-fitting, engagement or thread. Moreover, the sleeves 1026, 1046 may be made of, but not limited to, rubber.

When the aforesaid cable 14 is sandwiched in between the first cable management unit 102 and the bottom 1010 of the cable management recess 1000 and is pulled to move, the sleeve 1026 of the first cable management unit 102 will rotate along with the cable 14 with respect to the rod 1024. Similarly, when the aforesaid cable 14 is sandwiched in between the second cable management unit 104 and the bottom 1010 of the cable management recess 1000 and is pulled to move, the sleeve 1046 of the second cable management unit 104 will rotate along with the cable 14 with respect to the rod 1044. In practical applications, a lubricant may be added between the sleeves 1026, 1046 and the rods 1024, 1044, such that the sleeves 1026, 1046 can rotate with respect to the rods 1024, 1044 smoothly by the lubricant.

Figure 10:
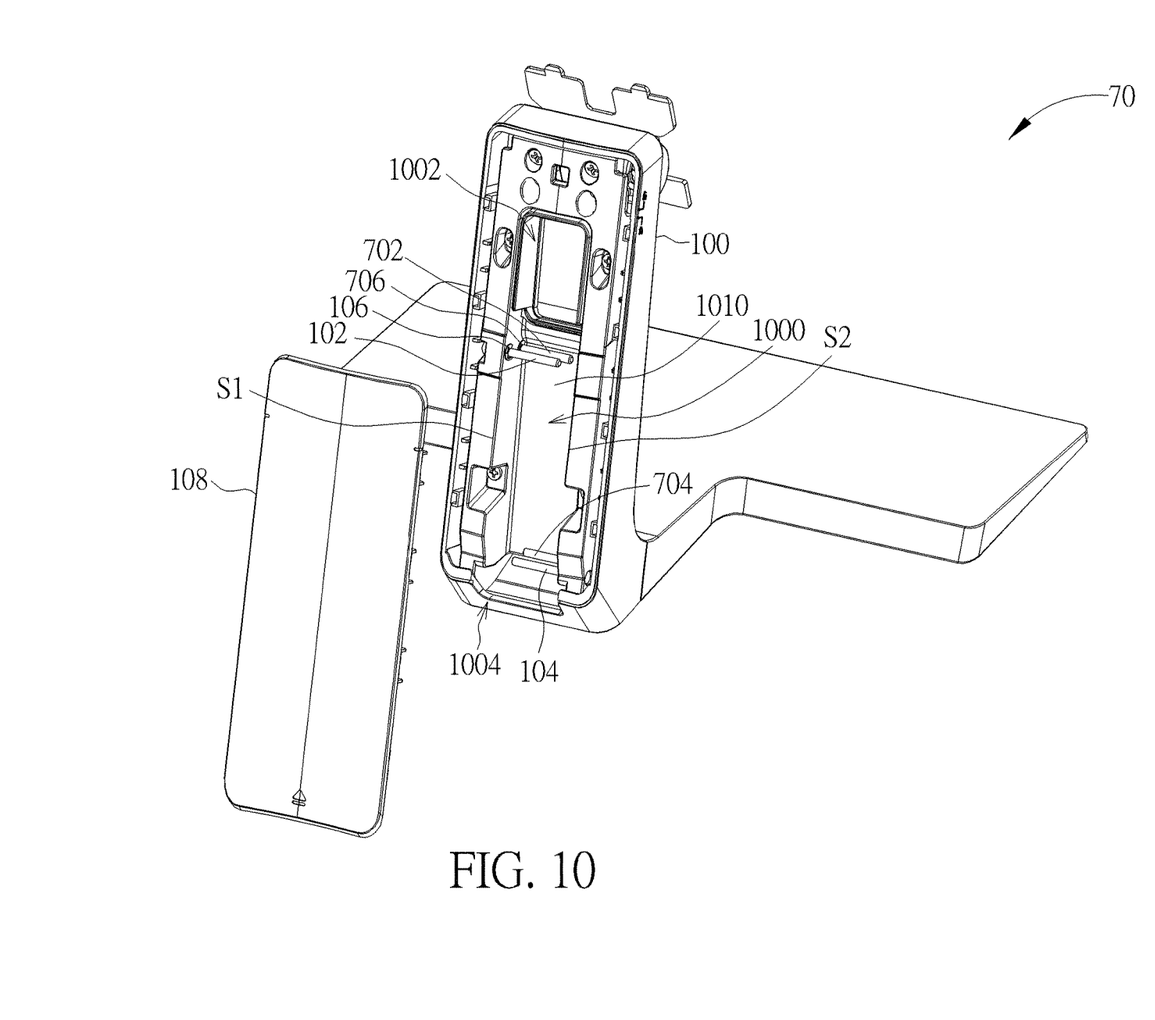
FIG. 10 is a perspective view illustrating a support frame according to another embodiment of the invention.
Figure 11:
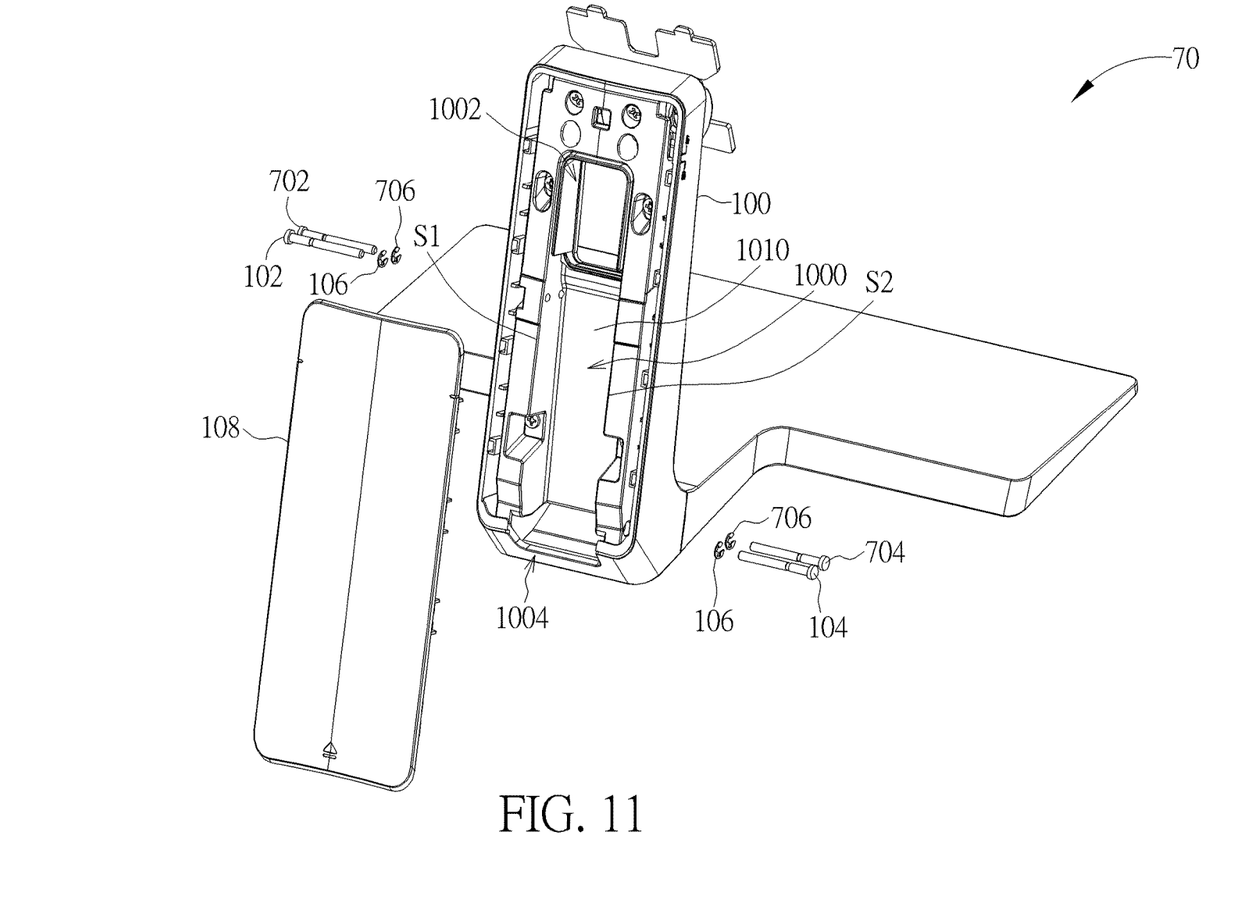
FIG. 11 is a partial exploded view illustrating the support frame shown in FIG. 10.

Referring to FIGS. 10 and 11, FIG. 10 is a perspective view illustrating a support frame 70 according to another embodiment of the invention and FIG. 11 is a partial exploded view illustrating the support frame 70 shown in FIG. 10. The main difference between the support frame 70 and the aforesaid support frame 10 is that the support frame 70 further comprises a third cable management unit 702, a fourth cable management unit 704 and two retainers 706, as shown in FIGS. 10 and 11. The third cable management unit 702 is connected to the first side S1 of the frame body 100 and rotatably located in the cable management recess 1000, wherein the third cable management unit 702 is located between the first cable management unit 102 and the bottom 1010 of the cable management recess 1000. Furthermore, the fourth cable management unit 704 is connected to the second side S2 of the frame body 100 and rotatably located in the cable management recess 1000, wherein the fourth cable management unit 704 is located between the second cable management unit 104 and the bottom 1010 of the cable management recess 1000.

In this embodiment, the third cable management unit 702 and the fourth cable management unit 704 may be rotatably connected to the first side S1 and the second side S2 of the frame body 100 by the retainers 706. It should be noted that the assembly, structure and principle of the third cable management unit 702, the fourth cable management unit 704 and the retainers 706 are identical to those of the first cable management unit 102, the second cable management unit 104 and the retainers 106 mentioned in the above, so they will not be depicted herein again. Furthermore, the first cable management unit 102, the second cable management unit 104, the third cable management unit 702 and the fourth cable management unit 704 may also be implemented by the embodiments shown in FIGS. 6-7 or FIGS. 8-9.

In this embodiment, the aforesaid cable 14 may be sandwiched in between the first cable management unit 102 and the third cable management unit 702 and sandwiched in between the second cable management unit 104 and the fourth cable management unit 704. When the cable 14 is pulled to move, the first cable management unit 102, the second cable management unit 104, the third cable management unit 702 and the fourth cable management unit 704 will rotate along with the cable 14.

As mentioned in the above, the invention disposes a rotatable cable management unit in the support frame. A user can insert the cable into the cable management hole of the support frame to store the cable in the cable management recess of the support frame and utilize the cable management unit to limit the cable in the cable management recess. Since the cable management unit is rotatable, the cable management unit will rotate along with the cable when the cable is pulled to move. Accordingly, the user can pull the cable to move smoothly to manage the cable stored in the cable management recess of the support frame. Therefore, the invention can achieve cable management function and enhance visual effect for the electronic device by the support frame.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device comprising:
a support frame comprising a frame body and a first cable management unit, the frame body having a cable management recess and a cable management hole, the cable management recess communicating with the cable management hole, the first cable management unit being connected to the frame body and rotatably located in the cable management recess, wherein the support frame further comprises a retainer, the first cable management unit has an indentation, and the retainer engages with the indentation, such that the first cable management unit is rotatable;
an electronic unit disposed on the frame body; and
a cable having a first end and a second end opposite to the first end, the first end being connected to the electronic unit, the second end passing through the cable management hole to enter the cable management recess, the first cable management unit limiting the cable in the cable management recess, the first cable management unit rotating along with the cable when the cable is pulled to move.

2. The electronic device of claim 1, wherein the cable management recess has a first axial direction, the first cable management unit has a second axial direction, and the first axial direction is different from the second axial direction.

3. The electronic device of claim 1, wherein the support frame further comprises a second cable management unit, the second cable management unit is connected to the frame body and rotatably located in the cable management recess, the first cable management unit and the second cable management unit are staggered, and the first cable management unit and the second cable management unit limit the cable in the cable management recess.

4. The electronic device of claim 3, wherein the first cable management unit is connected to a first side of the frame body, a free end of the first cable management unit is oriented toward a second side of the frame body, the second cable management unit is connected to the second side of the frame body, a free end of the second cable management unit is oriented toward the first side of the frame body, and the first side is opposite to the second side.

5. The electronic device of claim 1, wherein the support frame further comprises a third cable management unit, the third cable management unit is connected to the frame body and rotatably located in the cable management recess, the third cable management unit is located between the first cable management unit and a bottom of the cable management recess, and the cable is sandwiched in between the first cable management unit and the third cable management unit.

6. The electronic device of claim 1, wherein the support frame further comprises a cover disposed on the frame body and covering the cable management recess.

7. The electronic device of claim 1, wherein the frame body further has a cable outlet, the cable management recess communicates with the cable outlet, and the second end passes through the cable outlet to protrude from the frame body.

8. An electronic device comprising:
   a support frame comprising a frame body and a first cable management unit, the frame body having a cable management recess and a cable management hole, the cable management recess communicating with the cable management hole, the first cable management unit being connected to the frame body and rotatably located in the cable management recess, wherein the support frame further comprises a bearing, the bearing is disposed on the frame body, and the first cable management unit is connected to the bearing, such that the first cable management unit is rotatable;
   an electronic unit disposed on the frame body; and
   a cable having a first end and a second end opposite to the first end, the first end being connected to the electronic unit, the second end passing through the cable management hole to enter the cable management recess, the first cable management unit limiting the cable in the cable management recess, the first cable management unit rotating along with the cable when the cable is pulled to move.

9. The electronic device of claim 8, wherein the cable management recess has a first axial direction, the first cable management unit has a second axial direction, and the first axial direction is different from the second axial direction.

10. The electronic device of claim 8, wherein the support frame further comprises a second cable management unit, the second cable management unit is connected to the frame body and rotatably located in the cable management recess, the first cable management unit and the second cable management unit are staggered, and the first cable management unit and the second cable management unit limit the cable in the cable management recess.

11. The electronic device of claim 10, wherein the first cable management unit is connected to a first side of the frame body, a free end of the first cable management unit is oriented toward a second side of the frame body, the second cable management unit is connected to the second side of the frame body, a free end of the second cable management unit is oriented toward the first side of the frame body, and the first side is opposite to the second side.

12. The electronic device of claim 8, wherein the support frame further comprises a third cable management unit, the third cable management unit is connected to the frame body and rotatably located in the cable management recess, the third cable management unit is located between the first cable management unit and a bottom of the cable management recess, and the cable is sandwiched in between the first cable management unit and the third cable management unit.

13. The electronic device of claim 8, wherein the support frame further comprises a cover disposed on the frame body and covering the cable management recess.

14. The electronic device of claim 8, wherein the frame body further has a cable outlet, the cable management recess communicates with the cable outlet, and the second end passes through the cable outlet to protrude from the frame body.

* * * * *